US008925739B2

(12) United States Patent  (10) Patent No.: US 8,925,739 B2
Crippen et al.  (45) Date of Patent: Jan. 6, 2015

(54) HIGH-CAPACITY COMPUTER RACK WITH REAR-ACCESSIBLE SIDE BAYS

(75) Inventors: Martin J. Crippen, Apex, NC (US); Karl Dittus, Durham, NC (US); Eric A. Eckberg, Rochester, MN (US); John H. Mohlke, Pine Island, MN (US); Randy J. Speltz, Plainview, MN (US); Robert W. Stegner, Raleigh, NC (US); Ronald S. Taylor, Cary, NC (US); Gregory S. Vande Corput, Rochester, MN (US); Charles E. White, III, Raleigh, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 76 days.

(21) Appl. No.: 13/559,163

(22) Filed: Jul. 26, 2012

(65) Prior Publication Data

US 2014/0027392 A1 Jan. 30, 2014

(51) Int. Cl.
| *A47F 7/00* | (2006.01) |
| *A47B 81/00* | (2006.01) |
| *A47G 29/00* | (2006.01) |
| *G06F 1/16* | (2006.01) |
| *H05K 7/16* | (2006.01) |

(52) U.S. Cl.
USPC .. 211/26; 312/223.1; 312/265.3; 361/679.39; 361/727

(58) Field of Classification Search
USPC ............... 312/223.1, 236, 265.1–265.4; 361/679.37–679.41, 724–727; 211/26
See application file for complete search history.

(56) References Cited

U.S. PATENT DOCUMENTS

| 5,297,229 | A | | 3/1994 | Shimada et al. | |
|---|---|---|---|---|---|
| 5,890,783 | A | * | 4/1999 | Babcock et al. | 312/265.3 |
| 5,905,631 | A | * | 5/1999 | Winkler | 361/641 |
| 6,018,457 | A | * | 1/2000 | Mroz | 361/679.31 |
| 6,040,982 | A | * | 3/2000 | Gandre et al. | 361/724 |
| 6,052,274 | A | * | 4/2000 | Remsburg | 361/679.58 |
| 6,102,214 | A | * | 8/2000 | Mendoza | 211/26 |
| 6,229,691 | B1 | | 5/2001 | Tanzer et al. | |
| 6,239,978 | B1 | * | 5/2001 | Liao | 361/756 |
| 6,259,605 | B1 | * | 7/2001 | Schmitt | 361/727 |
| 6,307,750 | B1 | * | 10/2001 | Bendikas et al. | 361/725 |
| 6,421,243 | B1 | * | 7/2002 | Ives et al. | 361/725 |
| 6,422,399 | B1 | * | 7/2002 | Castillo et al. | 211/26 |
| 6,425,488 | B1 | * | 7/2002 | Notohardjono et al. | 211/26 |
| 6,467,633 | B1 | | 10/2002 | Mendoza | |
| 6,535,377 | B2 | | 3/2003 | Carteau et al. | |
| 6,587,347 | B1 | | 7/2003 | Lane, Jr. et al. | |
| 6,643,141 | B2 | * | 11/2003 | Kaetsu et al. | 361/797 |
| 6,661,667 | B2 | * | 12/2003 | Robbins et al. | 361/727 |
| 6,741,463 | B1 | * | 5/2004 | Akhtar et al. | 361/679.41 |
| 6,769,551 | B2 | * | 8/2004 | Rafferty et al. | 211/26 |

(Continued)

*Primary Examiner* — Jonathan Liu
*Assistant Examiner* — Devin Barnett
(74) *Attorney, Agent, or Firm* — Katherine S. Brown; Jeffrey L. Streets

(57) ABSTRACT

An embodiment of a computer rack is capable of supporting up to 48U of electronic devices, including a central rack space for up to 42U and six 1U side bays. The side bays are fully accessible from the rear of the rack, so that all of the components may be serviced without pulling the rack out from a row and removing side panels. Optional strip PDUs may be mounted at the rear. The rack complies with standard dimensions for a 19-inch rack, including standard vertical and horizontal rail dimensions, and fits on a standard 600 mm×1200 mm floor tile.

12 Claims, 8 Drawing Sheets

(56) References Cited

U.S. PATENT DOCUMENTS

| | | | |
|---|---|---|---|
| 6,771,499 B2 * | 8/2004 | Crippen et al. | 361/679.48 |
| 6,785,459 B2 * | 8/2004 | Schmidt et al. | 385/134 |
| 6,807,062 B2 * | 10/2004 | Lauchner | 361/725 |
| 6,819,567 B2 * | 11/2004 | Baker et al. | 361/724 |
| 6,840,388 B2 * | 1/2005 | Mayer | 211/26 |
| 6,847,526 B2 * | 1/2005 | Robbins et al. | 361/727 |
| 6,870,095 B1 * | 3/2005 | Whitted | 174/481 |
| 6,891,727 B2 * | 5/2005 | Dittus et al. | 361/724 |
| 7,012,808 B2 * | 3/2006 | Mayer | 361/725 |
| 7,074,123 B2 * | 7/2006 | Bettridge et al. | 454/184 |
| 7,113,991 B1 * | 9/2006 | Miyamoto et al. | 709/226 |
| 7,193,857 B2 * | 3/2007 | Robbins et al. | 361/727 |
| 7,218,526 B2 * | 5/2007 | Mayer | 361/725 |
| 7,275,646 B2 * | 10/2007 | Mimlitch et al. | 211/26 |
| 7,385,810 B2 * | 6/2008 | Chu et al. | 361/679.48 |
| 7,472,970 B2 * | 1/2009 | Bergesch et al. | 312/223.1 |
| 7,495,169 B2 * | 2/2009 | Adducci et al. | 174/50 |
| 7,529,097 B2 * | 5/2009 | Coglitore et al. | 361/725 |
| 7,535,696 B2 * | 5/2009 | Ewing et al. | 361/622 |
| 7,643,285 B2 * | 1/2010 | Nishiyama et al. | 361/679.49 |
| 7,659,476 B2 * | 2/2010 | Hruby et al. | 174/50 |
| 7,710,715 B2 * | 5/2010 | Furey et al. | 361/679.02 |
| 7,764,495 B2 * | 7/2010 | Hruby et al. | 361/692 |
| 7,857,267 B2 * | 12/2010 | Watts | 248/200 |
| 7,878,889 B2 | 2/2011 | Day | |
| 7,907,402 B2 * | 3/2011 | Caveney | 361/694 |
| 7,929,279 B2 * | 4/2011 | Liu | 361/679.02 |
| 7,963,118 B2 * | 6/2011 | Porter et al. | 62/259.2 |
| 7,975,860 B2 * | 7/2011 | Dittus et al. | 211/207 |
| 8,004,827 B2 | 8/2011 | Ewing et al. | |
| 8,079,481 B2 * | 12/2011 | Canfield et al. | 211/26 |
| 8,096,861 B2 * | 1/2012 | Hanafusa | 454/184 |
| 8,113,009 B2 * | 2/2012 | Kuriyama et al. | 62/259.2 |
| 8,237,052 B2 * | 8/2012 | Adducci et al. | 174/50 |
| 8,248,811 B2 * | 8/2012 | Peng et al. | 361/756 |
| 8,317,274 B2 * | 11/2012 | Hsiao | 312/223.1 |
| 8,353,492 B2 * | 1/2013 | Mattlin et al. | 248/221.11 |
| 8,369,087 B2 * | 2/2013 | Wu et al. | 361/679.58 |
| 8,432,689 B2 * | 4/2013 | Coglitore et al. | 361/679.58 |
| 8,453,713 B2 * | 6/2013 | Delia et al. | 165/11.1 |
| 8,459,756 B2 * | 6/2013 | Linhares et al. | 312/265.3 |
| 8,490,799 B2 * | 7/2013 | Knight et al. | 211/26 |
| 8,534,775 B1 * | 9/2013 | Liang | 312/223.1 |
| 2002/0036894 A1 * | 3/2002 | Robbins et al. | 361/727 |
| 2002/0140325 A1 * | 10/2002 | Webster et al. | 312/223.1 |
| 2002/0172012 A1 * | 11/2002 | Chandler | 361/724 |
| 2003/0021091 A1 * | 1/2003 | Robbins et al. | 361/727 |
| 2003/0065958 A1 * | 4/2003 | Hansen et al. | 713/300 |
| 2004/0189161 A1 * | 9/2004 | Davis et al. | 312/265.3 |
| 2004/0201335 A1 * | 10/2004 | Davis | 312/265.3 |
| 2005/0068716 A1 * | 3/2005 | Pereira | 361/624 |
| 2005/0083651 A1 * | 4/2005 | Smith et al. | 361/687 |
| 2005/0105279 A1 * | 5/2005 | Robbins et al. | 361/727 |
| 2005/0117310 A1 * | 6/2005 | Miyamoto et al. | 361/724 |
| 2006/0141921 A1 * | 6/2006 | Turek et al. | 454/184 |
| 2007/0210686 A1 * | 9/2007 | Adducci et al. | 312/265.2 |
| 2008/0062654 A1 * | 3/2008 | Mattlin et al. | 361/727 |
| 2008/0093927 A1 * | 4/2008 | Ewing et al. | 307/23 |
| 2008/0131227 A1 * | 6/2008 | Maresh et al. | 410/145 |
| 2008/0225496 A1 * | 9/2008 | Fujiya et al. | 361/727 |
| 2009/0014614 A1 * | 1/2009 | Warmoth et al. | 248/309.1 |
| 2009/0086441 A1 * | 4/2009 | Randall et al. | 361/724 |
| 2009/0097210 A1 * | 4/2009 | Su et al. | 361/726 |
| 2009/0116178 A1 | 5/2009 | Champion et al. | |
| 2009/0188659 A1 * | 7/2009 | Delia et al. | 165/239 |
| 2009/0224639 A1 * | 9/2009 | Sosin | 312/223.1 |
| 2009/0231800 A1 * | 9/2009 | Franz et al. | 361/679.37 |
| 2009/0250236 A1 * | 10/2009 | Corwin et al. | 174/59 |
| 2009/0261211 A1 * | 10/2009 | Anguiano-Wehde et al. | 248/56 |
| 2010/0254100 A1 * | 10/2010 | Kim et al. | 361/752 |
| 2011/0074258 A1 * | 3/2011 | Takahashi et al. | 312/223.1 |
| 2011/0155674 A1 * | 6/2011 | Knight et al. | 211/26 |
| 2011/0315353 A1 * | 12/2011 | Campbell et al. | 165/104.31 |
| 2012/0007478 A1 * | 1/2012 | Fan | 312/223.2 |
| 2012/0018389 A1 * | 1/2012 | Fan | 211/26 |
| 2012/0049706 A1 * | 3/2012 | Cottuli et al. | 312/236 |
| 2012/0052788 A1 * | 3/2012 | Mallia et al. | 454/289 |
| 2012/0061335 A1 * | 3/2012 | Fan et al. | 211/26 |
| 2012/0062083 A1 * | 3/2012 | Lewis et al. | 312/223.1 |
| 2012/0062084 A1 * | 3/2012 | Lewis et al. | 312/223.6 |
| 2012/0106079 A1 * | 5/2012 | Gomez | 361/679.58 |
| 2012/0113570 A1 * | 5/2012 | Yang et al. | 361/679.01 |
| 2012/0155011 A1 * | 6/2012 | Arisaka et al. | 361/679.37 |
| 2012/0207573 A1 * | 8/2012 | McIntosh et al. | 414/589 |
| 2012/0250261 A1 * | 10/2012 | Peng et al. | 361/724 |
| 2012/0273438 A1 * | 11/2012 | Nordin et al. | 211/26 |
| 2013/0188309 A1 * | 7/2013 | Ross | 361/679.48 |
| 2013/0263450 A1 * | 10/2013 | Eckberg et al. | 29/890.03 |
| 2013/0264026 A1 * | 10/2013 | Eckberg et al. | 165/67 |
| 2013/0264027 A1 * | 10/2013 | Eckberg et al. | 165/67 |
| 2013/0264030 A1 * | 10/2013 | Eckberg et al. | 165/80.4 |
| 2013/0265719 A1 * | 10/2013 | Eckberg et al. | 361/701 |
| 2013/0286599 A1 * | 10/2013 | Fan | 361/726 |

* cited by examiner

HIGH-CAPACITY COMPUTER RACK WITH REAR-ACCESSIBLE SIDE BAYS

BACKGROUND

1. Field of the Invention

The present invention relates to rack-mounted electronic systems and equipment racks.

2. Background of the Related Art

Some electronic systems are designed for servicing a large population of users, such as employees of a large corporation, residents of a town, or even a global network of users. Common examples include a telecommunications system operated on behalf of a town for providing local telephone service to its residents, and a large system of computer servers used by an Internet search engine to process a large volume of search queries from users worldwide. An electronic system with sufficient power and resources to service such large workloads may be assembled from many units of modular electronics equipment. The computer servers, telecommunications devices, and other electronic equipment used in these systems can be consolidated in a particular location for centralized administration. In a data center, for example, electronic equipment is typically housed in standardized racks and rack-mountable equipment enclosures. A number of these racks are commonly placed in a data center and arranged side-by-side in rows that form alternating hot-aisles and cold-aisles for efficient cooling of the equipment.

An equipment rack commonly includes a plurality of mounting and alignment substructures that facilitate mounting various devices in the rack. For example, a rack typically includes vertical rails and horizontal rails for directly mounting individual devices or mounting support structures, such as shelves, drawers, and chassis, which in turn support the devices. The rack and various rack-mountable electronic equipment may be constructed according to an industrial standard set forth by a trade organization, such as the Electronic Industries Alliance (EIA). (While the EIA trade organization ceased operations in 2011, the EIA standards are still recognized in the industry and managed by surviving trade organizations.)

Dimensional constraints are imposed by industry rack standards to ensure uniformity and compatibility of racks and rack-mounted devices. An EIA "19-inch" rack, for example, requires vertical rails having a minimum width of 16.7 mm and a distance of 450 mm between opposing vertical side rails. This yields an overall width of nominally 483 mm (19 inches) from the outer edge of one vertical rail to the outer edge of the opposing vertical rail. The rack, itself may be wider than 19 inches. Rack-mountable devices according to this standard have one dimension that is 19 inches to the end of mounting flanges, and another dimension that is some integer multiple of a unit length known as "1U" that is nominally 1.75 inches (44.45 mm). For example, a 1U server or other device has a height or width of 1.75 inches, a 2U server has a height or width of 3.5 inches, and so forth. Although these dimensional constraints provide compatibility and uniformity, they also present some design challenges in order to comply with specific dimensional constraints.

BRIEF SUMMARY

According to one embodiment of the present invention, an electronic equipment rack includes a rack frame having a front, a rear, and opposing sides. A pair of vertical rails in the rack frame is spaced apart and have vertically-spaced mounting holes for mounting a column of components within a central rack space within the rack frame. A plurality of 1U side bays are provided on opposite sides of the central rack space and outward of the vertical rails. Each vertical rail and a nearest side of the rack frame define an opening at the rear of the rack frame for receiving a vertically-oriented 1U component inserted into the respective 1U side bay from the rear. The rack may comply with standard rack dimensions, such as with a vertical-rail spacing of at least 450 mm and a vertical-rail width of at least 16.7 mm. The rack may also have a width of no more than 600 mm and a depth of no more than 1200 mm to fit within a standard floor tile. Despite compliance with dimensional standards, the rack may receive up to 48U of electronic devices, including 42U of electronic devices in a central rack space and up to six 1U electronic devices in the side bays.

DETAILED DESCRIPTION

Figure 1:
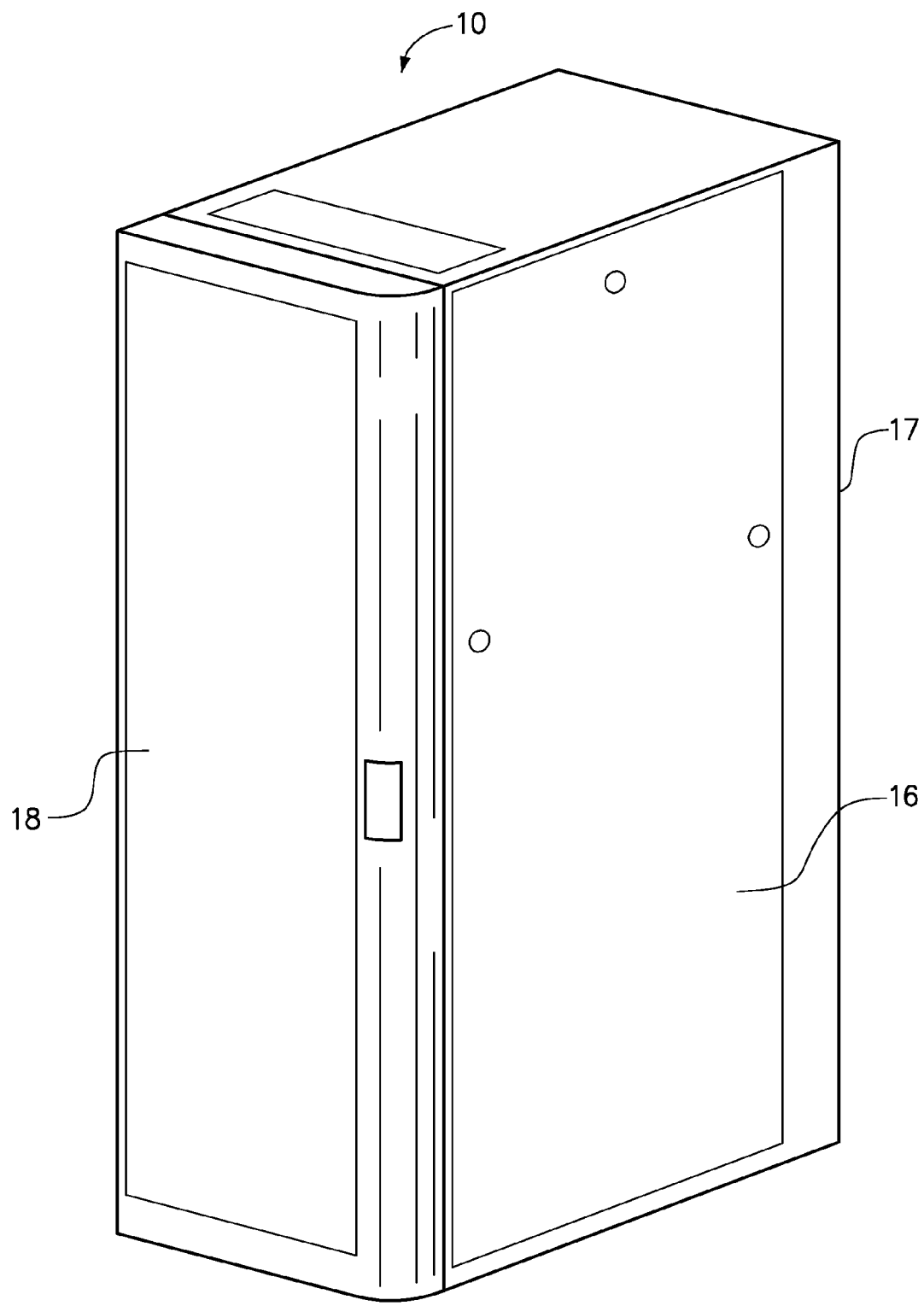
FIG. 1 is a rear perspective view of an EIA-compliant rack in accordance with the present invention.

A rack configuration is disclosed that provides an array of features not previously available due to dimensional constraints imposed by rack standards. These new features include support for up to 48U of devices in a rack that is no more than 600 mm wide. The support for 48U of devices includes a central rack space for receiving up to 42U of devices, and six 1U device bays (three per side). These side bays are fully accessible from the rear of the rack, in contrast to prior art 600 mm racks that, due to dimensional constraints, have required removing rack side panels to access similarly-located outer devices. With the 42U column of devices being accessible from the front and the six 1U side bays being accessible from the rear, all of the devices in the rack may be removed and replaced from the front and rear. This eliminates the need to remove the rack from an aisle in order to obtain access to the outer 1U devices. Additional features that facilitate making the rack fully serviceable from the front and rear include improved cable routing features, such as fully enclosed front-to-rear cable channels with specially configured apertures for organizing and securing the cables. The six 1U side bays may, for example, be used for power distribution units (PDUs). The rack even provides support for additional strip-type PDUs behind the 1U side bays.

An example embodiment discussed below is a 19-inch rack (i.e. a rack that conforms to a 19-inch rack standard) that is no more than 600 mm wide and 1200 mm deep, which allows the rack to fit on a standard 600 mm×1200 mm floor tile. The dimensional constraints for a 19-inch rack include a 450 mm minimum spacing between vertical rails, a 16.7 mm vertical rail width, and 44.45 mm (1U) of space outward of the vertical rails, which in a 600 mm wide rack leaves only a very limited 27.8 mm for any remaining structural features. These dimensional constraints have led makers of prior art racks to require access to the sides of the rack. In the disclosed rack configuration, the juncture between the horizontal and vertical rails enable the rear-accessible side bays while still complying with the dimensional constraints. The vertical rail has an L-shaped cross section for rigidity, with a first leg parallel with the rear of the rack and a second leg perpendicular to the first leg. The first leg of the vertical rail contains mounting holes for mounting the central column of devices. Each horizontal rail, extending along the sides of the rack, includes mounting holes for mounting brackets to support the 1U devices in the side bays. The portion of the horizontal rail containing the mounting holes is offset outwardly from the second leg of the vertical rail. The offset portion ensures that the mounting hardware on the horizontal rail does not interfere with devices in the central rack space. The offset portion also allows the 1U side bays to be positioned closely to the second leg, which helps minimize the overall rack width so as not to exceed 600 mm. An upset portion is provided at the end of the rail to bridge the offset, so the horizontal rail can still be welded to the vertical rail at the second leg.

FIG. 1 is a rear perspective view of a 19-inch rack 10 that may comply with all of the dimensional constraints specified by a 19-inch rack standard, yet provides numerous features not previously available on EIA-compliant racks due to those dimensional constraints. The rack 10 includes exterior rack side panels 16 on the left and right sides, a rack grill 17 supported on the front of the rack, and a rack grill 18 on the back of the rack. Optionally, the rack grill 18 includes a liquid-cooled rack heat exchanger secured to the back of the rack. The side panels 16, grill 17, and rear heat exchanger 18 may each protect and cosmetically cover the rack-mounted electronic devices. The grill 17 may also filter out large particles or even dust from airflow entering the rack 10. The liquid-cooled heat exchanger 18 may have serpentine liquid flow passages that cool the airflow as it exits the rack. The heat exchanger 18 may be a rear-door heat exchanger pivotably mounted to a rear edge of the frame that may be opened to access the rack-mounted devices. The rear-door heat exchanger may provide 100% or more heat removal. The exterior rack side panels 16, grill 17, and heat exchanger 18 are supported by a rack frame 30, shown in FIG. 2, which also supports internally-mounted equipment, such as electronic devices and support structures used to mount the electronic devices.

Figure 2:
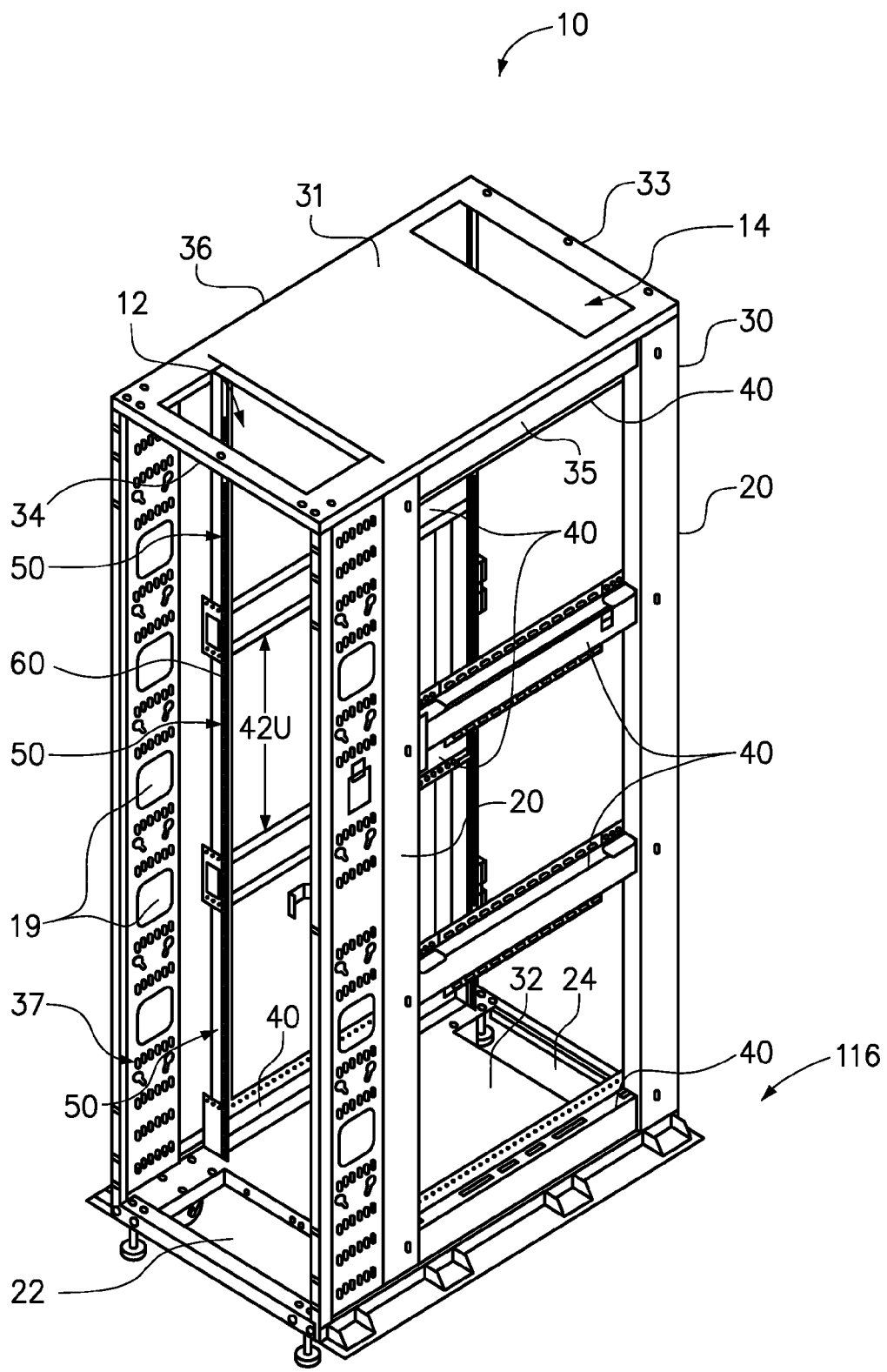
FIG. 2 is a rear perspective view of the rack frame.

FIG. 2 is a rear perspective view of the rack frame 30. The rack frame 30 has a top 31, a bottom or base 32, a front 33 to which the grill (grill 17 of FIG. 1) is secured, a rear 34 to which the heat exchanger (heat exchanger 18 of FIG. 1) is secured, and opposing left and right sides 35, 36 to which the side panels (side panels 16 of FIG. 1) are secured. An outrigger 116 is temporarily attached to the base 32. The outrigger 116 is a removable safety feature allowing safe transport of nonsymmetrical loaded configurations within the rack, and is to be removed at customer site. The rack footprint (with the outrigger 116 removed) is no greater than 600×1200 mm so that the rack fits within a standard 600×1200 datacenter floor tile. The rack frame 30 may be constructed primarily of sheet metal parts that are formed into structural shapes and joined by welding or other conventional joining techniques. The rack frame 30 includes four outer, vertical posts 20 (i.e. the rack 10 is a four-post rack) providing the primary structural support for other structural members of the rack, such as the top 31, base 32, and horizontal and vertical rails 40, 60. The horizontal and vertical rails 40, 60 are supporting structures used for mounting electronic devices inside the rack. The horizontal rails 40 and vertical rails 60 have mounting holes for mounting up-to 48U of electronic devices, such as servers and PDUs. The rack frame 30 can support a vertical column of up to 42U of rack-mounted devices between the vertical rails 60. The vertical rails 60 can be used for mounting substructures like shelves, ball-bearing assemblies for drawers, and/or one or more server chassis, on which this column of rack-mounted devices may be supported. The rack frame 30 also includes three 1U side bays 50 on each side of the central rack space, for receiving up to six additional 1U devices such as PDUs. A PDU or other 1U electronic device may be inserted into each 1U side bay 50 from the rear 34 of the rack frame 30. The horizontal rails 40 can receive hardware such as clip nuts for mounting brackets used to support devices in the 1U side bays 50. The horizontal rails 40 extend to the vertical rails 60 and are at vertical positions above, below, or between vertically-adjacent side bays 50.

The rack frame 30 further provides a number of cable management features. The cable management features includes cable ingress/egress upper windows 12, 14 in the top 31 of the rack and cable ingress/egress lower windows 22, 24 in the base 32 of the rack, for bulk routing of cables to and from the rack. Cable egress side windows 19 are provided at different levels along the sides 35, 36 for routing cables to and from electronic devices to be mounted at different vertical positions within the rack 10. In addition to providing structural support for rack-mounted equipment and stabilizing the vertical rails 60, the horizontal rails 40 also have integrated cable channels (discussed further with reference to FIGS. 6 and 7) for horizontally routing selected cables from the front 33 to the rear 34 of the rack. Cable tie points 37 are provided at various locations along the sides 35, 36.

Figure 3:
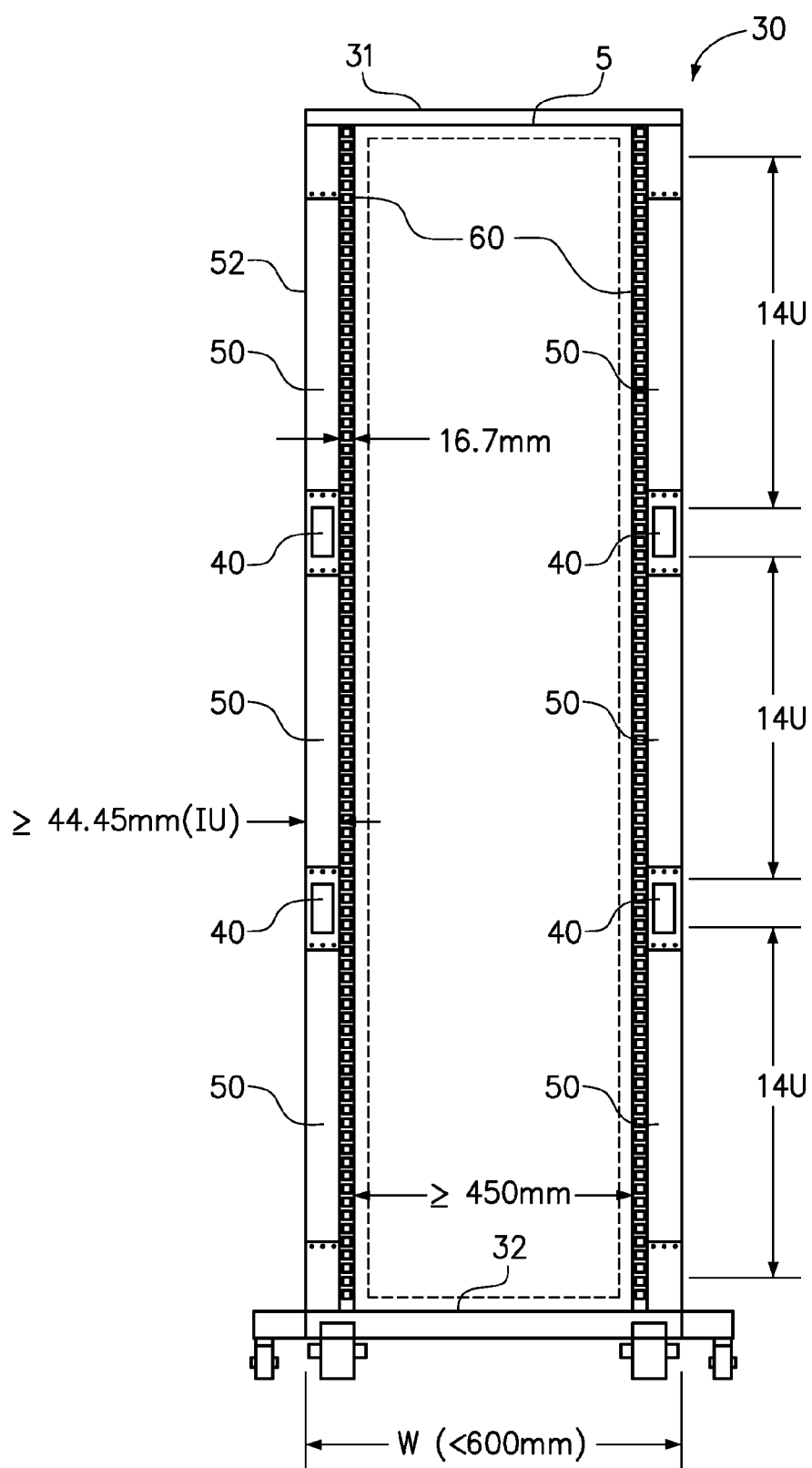
FIG. 3 is a rear, elevation view dimensionally detailing features of the rack frame.

FIG. 3 is a rear, elevation view dimensionally detailing features of the rack frame 30. The overall width "W" of the rack is less than or equal to 600 mm. The rack frame 30 defines a central rack space 5 between the top 31, bottom 32 and the opposing vertical rails 60 for mounting a central column of electronic devices. Support substructures such as drawer assemblies may be mounted at the vertical positions of the horizontal rails 40, and the central rack space 5 is thereby divided into three 14U sections above, below, and between the horizontal rails 40, to fit up to 42U of electronic devices in the central rack space 5. The horizontal spacing between vertical rails 60 is at least 450 mm, in conformance with a 19-inch rack standard. The vertical rails 60 are each at least 16.7 mm wide, for a total of about 483 mm (19 inches) between outer edges of the vertical rails 60. Each electronic device to be mounted in the central rack space 5 between the vertical rails 60 is generally 19 inches long (to the ends of the device flanges), by some integer multiple of 1U (44.45) tall. The flanges on the 19-inch (483 mm) electronic devices for mounting to the vertical rails 60 may extend to the outer edges of the vertical rails 60. The rack frame 30 also provides the six 1U side bays 50 (three per side) outside of the central rack space 5 for receiving up to six additional 1U devices. The 1U side bays 50 are at least about 1U (44.45 mm) wide and at least about 19 inches (483 mm) tall. Each of the six 1U side bays 50 is open at the rear of the rack and is wide enough to insert a 1U device into the side bay 50 from the rear of the rack. The 1U devices to be mounted within the side bays 50 are preferably PDUs, although any 1U device could conceivably be positioned in one of the side bays 50. The side bays 50 are further discussed with reference to FIG. 4.

Figure 4:
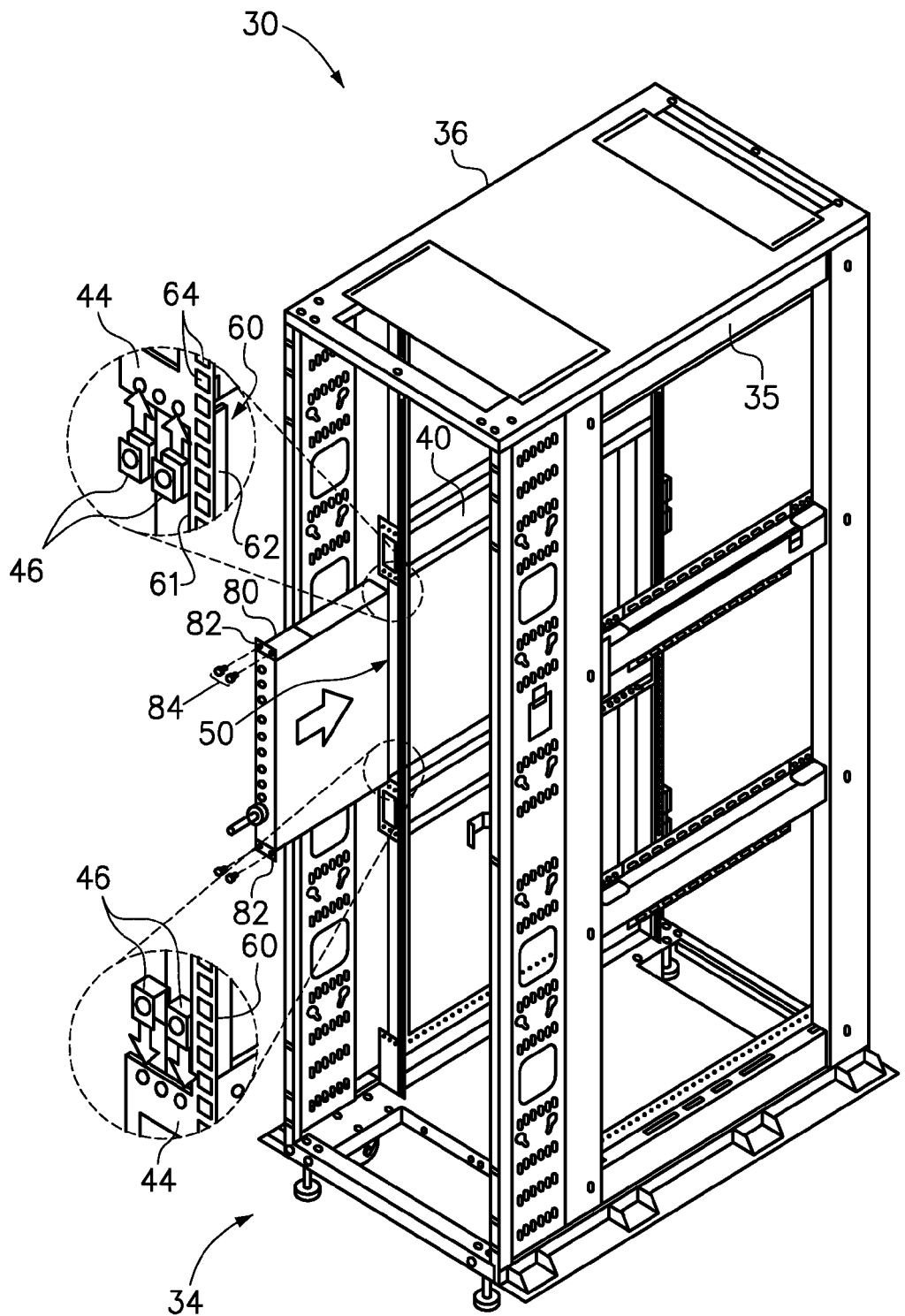
FIG. 4 is a rear perspective view of the rack frame illustrating an electronic device positioned for insertion into a selected 1U side bay.

FIG. 4 is a rear perspective view of the rack frame 30 illustrating a 1U electronic device 80 positioned for insertion into a selected 1U side bay 50. Each horizontal rail 40 has an end flange 44. Selected portions of the end flanges 44 and the vertical rail 60 are enlarged for detail. The device 80 is to be inserted into the selected side bay 50 from the rear 34 of the rack frame 30 until opposing device flanges 82 on the device 80 abut the end flanges 44 on the respective horizontal rails 40. Once inserted, the device 80 may be secured within the side bay 50 using holes on the end flanges 44. Other 1U devices may be similarly mounted in the other two 1U side bays above and below the middle 1U side bay 50. Although any of a variety of different mounting hardware may be used in different embodiments, this embodiment uses threaded tabs 46 (also referred to as clip nuts) positioned over the end flanges 44 prior to inserting the device 80 into the side bay 50. Mounting hardware such as threaded fasteners 84 pass through corresponding holes on the respective device flange 82 and end flange 44 and thread into the threaded tabs 46.

The enlarged portions in FIG. 4 also show details of one of the vertical rails 60. The vertical rail 60 has an L-shaped cross section, for rigidity, with first and second legs 61, 62. The first leg 61 is parallel to the rear 34 of the rack frame and coplanar with the end flanges 44, and provides vertical rail holes 64. The vertical rail holes 64 are square holes designed for use with threadless mounting hardware, which is generally known in the art apart from the particulars of this disclosure. The vertical rail holes 64 are used to secure electronic devices in the central 42U column, between the vertical rails 60. The second leg 62 forms a right angle with the first leg 61 and is oriented along a depth of the rack, i.e. parallel to the sides 35, 36 of the rack. The central column of up to 42U of electronic devices in the central rack space 5 will be positioned between (inward of) the second legs 62 of the vertical rails 60. The 1U devices in the side bays 50 will be positioned outside of the respective second leg 62, at the rear of the rack.

Figure 5:
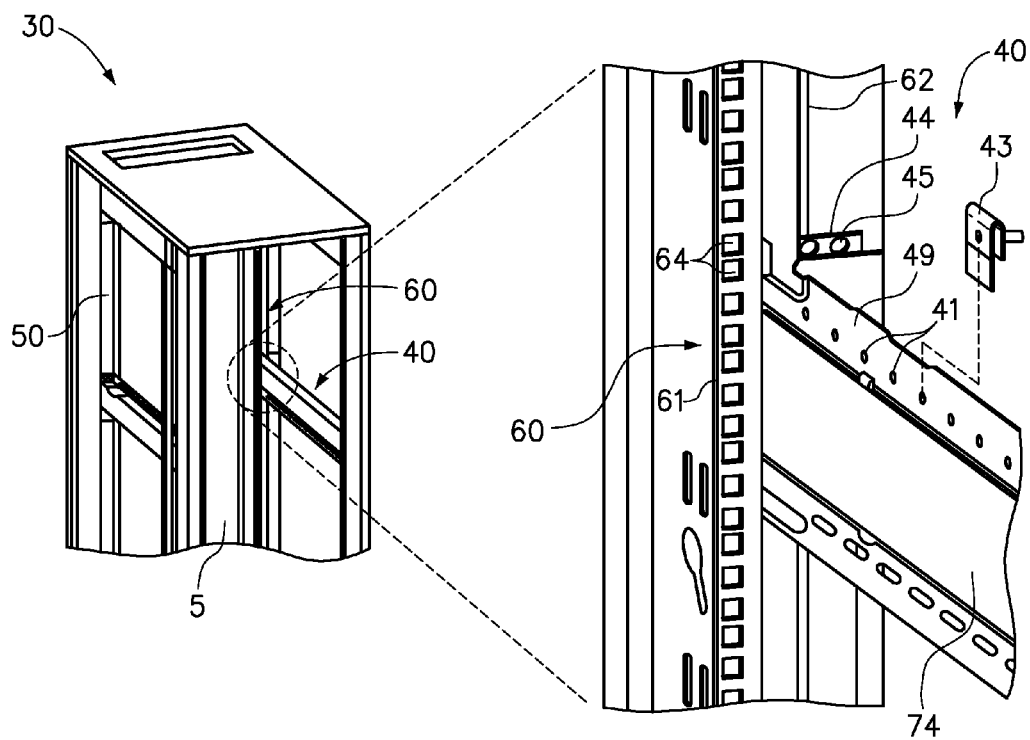
FIG. 5 is an enlarged perspective view of a juncture between a selected horizontal rail and vertical rail as viewed in the general direction of the arrow "A" in FIG. 4.

FIG. 5 is an enlarged perspective view of a juncture between a selected horizontal rail 40 and vertical rail 60 of the rack frame. The relative positioning between the horizontal rail 40 and the perpendicular first and second legs 61, 62 of the vertical rail 60 can be seen. The 42U column of devices will be positioned in the central rack space 5 to the inside of the second leg 62 (to the left in this view). The 1U device mounted in the side bay 50 will be positioned to the outside of the second leg 62 (to the right in this view). The vertical rail holes 64 are for receiving mechanical fasteners to support the devices in the central rack space 5. A plurality of horizontal rail holes 41 are for securing mounting brackets used to support devices mounted in the 1U side bays 50. The mechanical fasteners used to secure the brackets may include a conventional clip nut 43 for each hole 41, which can be slid over the upper edge of the horizontal rail 40 at the offset portion 49. The clip nut 43 has a threaded hole that will align with the horizontal rail holes 41 for receiving an externally-threaded member such as a machine screw. Once inserted, the 1U devices may be secured within the 1U side bays 50 using flange holes 45 on the end flange 44.

Several dimensional restrictions apply in the vicinity of this junction according to industry standards. A first dimensional restriction is that the space above the end flange 44 to the outside (right) of the second leg 62 of the vertical rail 60 be at least 44.45 mm wide. A second dimensional restriction is that the first leg 61 of the vertical rail 60 must extend at least 16.7 mm inward of the second leg 62. These restrictions are in addition to other dimensions discussed above, such as the minimum 450 mm rail spacing. The structural features of the horizontal rail 40 and the vertical rail and the juncture between these two parts allow for compliance with these restrictions. These structural features include an offset region 49 that is offset outwardly of the second leg 62 of the vertical rail 60. An embossed portion 47 bridges that offset and allows the horizontal rail 40 and vertical rail to be joined. The offset region 49 may be formed on the horizontal rail 40 and then joined to the second leg 62 of the vertical rail 60 by welding.

The offset region 49 and embossed portion 47 are below the 1U side bay 50, so that the 1U side bay 50 is positioned inwardly of the offset region 49 by the amount of the offset. Thus, the 1U device in the side bay 50 may be positioned closely to the second leg 62, which helps minimize the overall rack width so as not to exceed 600 mm. The offset region 49 also allows the mechanical fasteners (e.g. clip nuts 43 and machine screws that are to be threaded through the clip nuts 43) to be placed along the horizontal rail 40 without protruding into the central rack space 5. The offset region 49 may be sufficiently offset from the second leg 62 so that the mechanical fasteners (e.g. the clip nut 43 and a machine screw passing through the nut clip 43) do not project beyond the second leg 62 and into the central rack space 5, to avoid interference with the electronic devices to be mounted in the central rack space 5.

Figure 6:
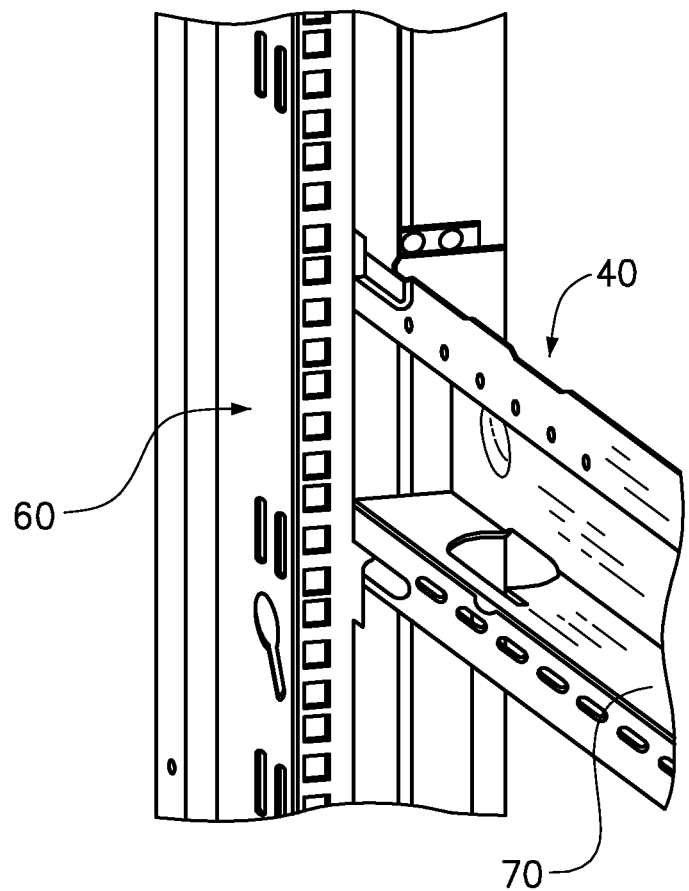
FIG. 6 is an enlarged perspective view of the horizontal and vertical rail juncture of FIG. 5, with the cover plate removed from the horizontal rail.
Figure 7:
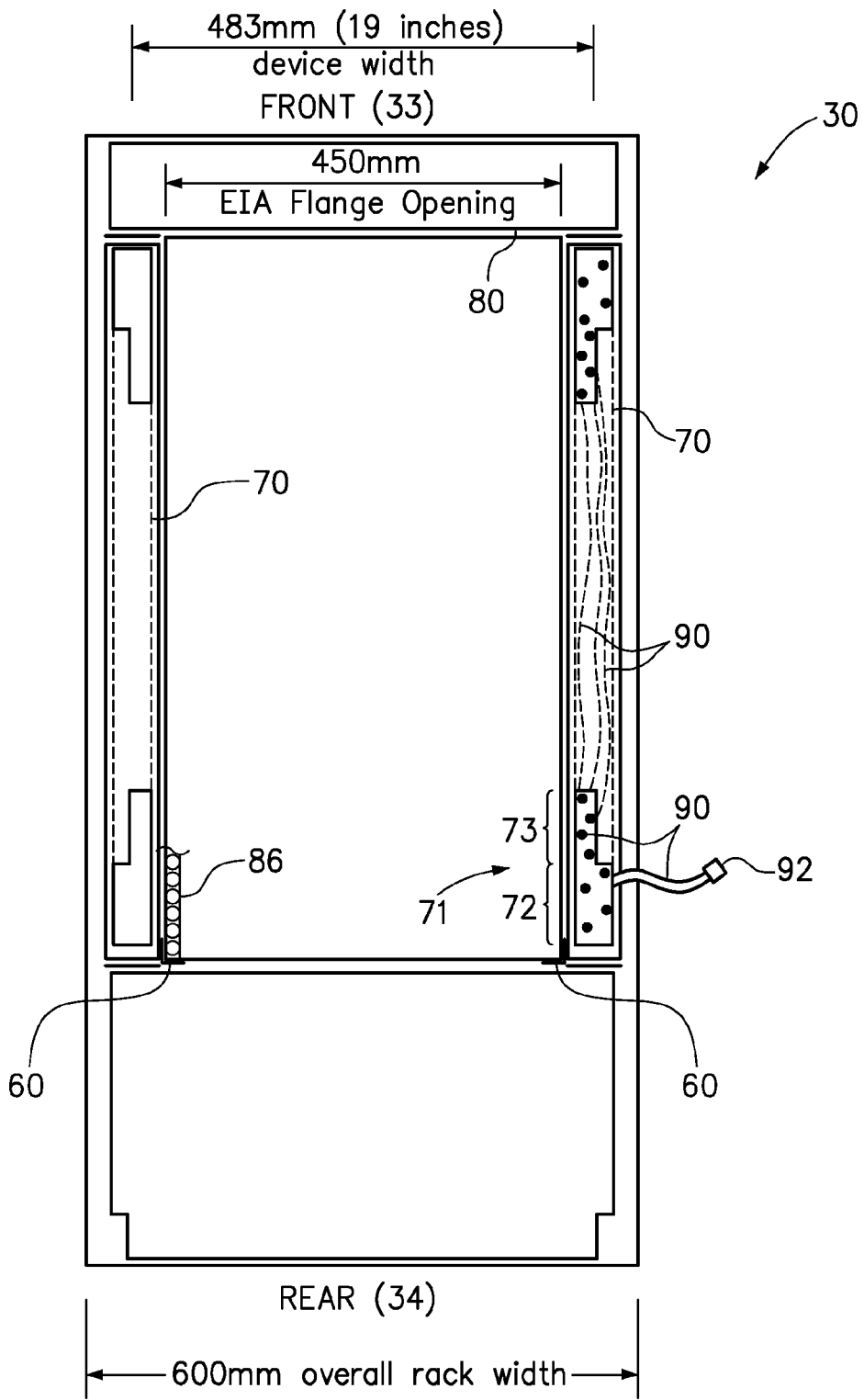
FIG. 7 is a top view of the rack frame selectively highlighting additional cable routing features provided on the horizontal rails.

With regard to cable routing features, FIG. 6 also shows the horizontal rail 40 with an attachable/removable cover plate 74 which covers an internal cable channel 70 (see FIGS. 6 and 7). An original installation technician may opt to route all cables through the channel first, then snap on the cover plate 74 instead of threading cables through the channel from front to back or vice-versa. This removable cover plate 74 is not accessible once electronic equipment or servers are mounted into the central rack space 5, so the cover plate 74 is typically removed for initial installation or on empty portions of the rack. For reference, FIG. 6 provides the same perspective view of the juncture between the selected horizontal rail 40 and vertical rail 60 with the side panel 74 removed, revealing the internal cable channel 70.

FIG. 7 is a schematic top view of the rack frame 30 with an outline of a representative 19-inch device 80 between the vertical rails 60. A conventional drawer slider assembly 86 is optionally provided for receiving the 19-inch device 80 or a chassis that holds a plurality of 19-inch devices. The 600 mm overall rack width, 483 mm (19 inch) overall device width, and 450 mm EIA flange opening are labeled for reference.

FIG. 7 also highlights additional cable routing features provided on the horizontal rails 40. The horizontal rails 40 define the fully-enclosed cable channels 70 that extend from-to-rear, i.e. extending in a direction from the front 33 of the rack frame 30 to the rear 34 of the rack frame 30. Some representative cables 90 are shown in one rail 40, as routed horizontally along the cable channels 70. A connector 92 at an end of one of the cables is schematically shown. Each cable channel 70 is fully enclosed and is large enough for many cables 90 to be routed through. Having the cables routed through the fully enclosed cable channel 70 keeps the cables 70 from falling down into the rack and getting hung up on other components in the rack. The horizontal rails 40 also include apertures 72 to the cable channels near the ends of the horizontal rails 40, for routing cables through the cable channels 70. In particular, for example, cables 90 can be routed to PDUs optionally mounted in the 1U side bays. Each aperture 71 includes a narrowed section 73 adjacent to a comparatively wider section 72. The wider section 72 of each aperture 71 is large enough to allow multiple cables 90 and their connectors to fit through. Cables 90 that have been routed through the cable channel 70 and out through the wider section 72 of the aperture 71 may then be moved by hand into the narrower section 73. This forces the cables 90 toward one side of the horizontal rails 40 and out of the way of any additional cables that may be routed through or for removing them from the cable channel 70. Moving the cables 90 into the narrowed section 73 may also help hold the cables 90 in position and prevent the cables 90 from falling down back through the aperture 71.

Figure 8:
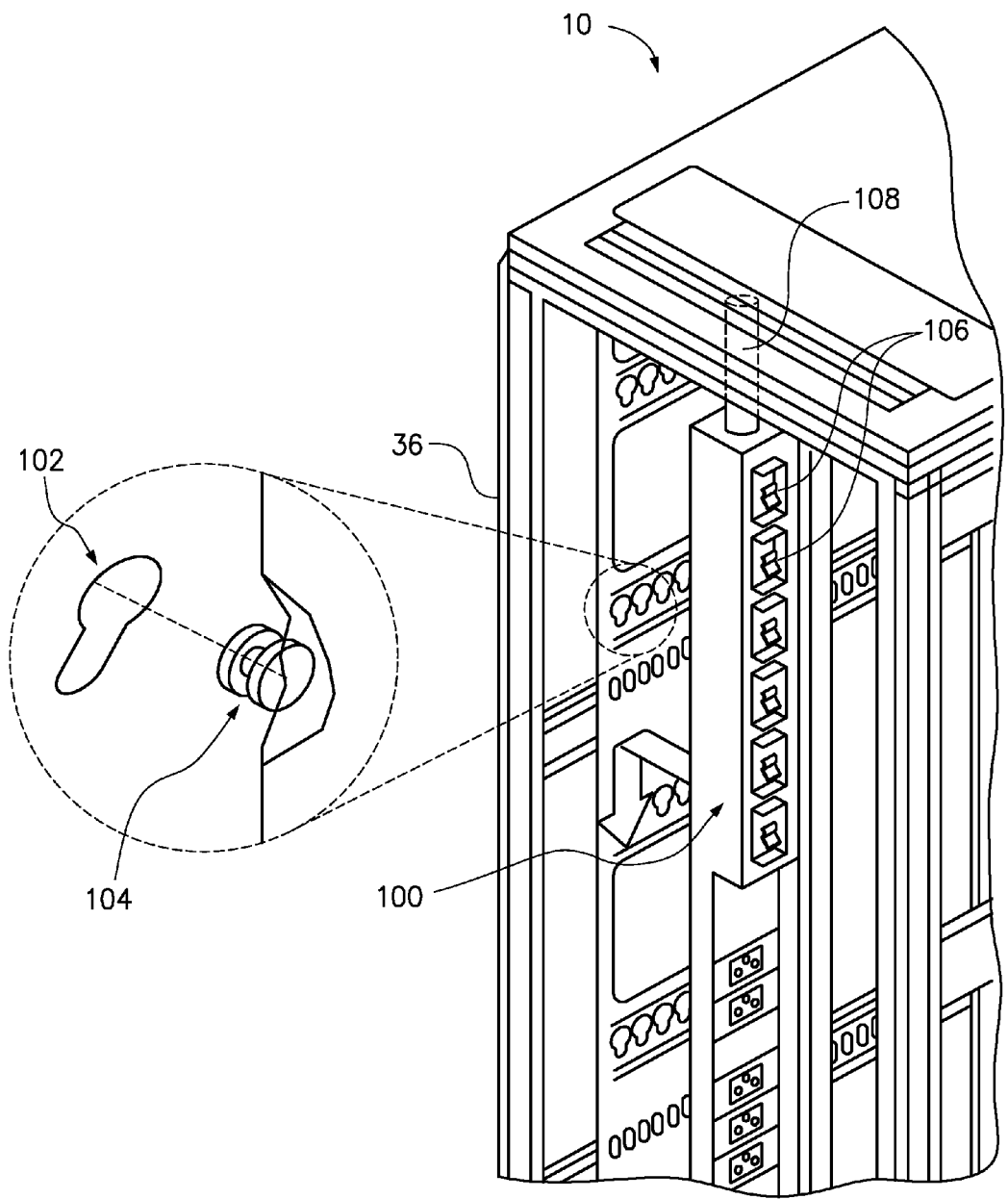
FIG. 8 is a perspective view of an upper corner of the rack illustrating an optional strip-type power distribution unit (PDU) mounted at the rear of the rack.

FIG. 8 is a perspective view of an upper corner of the rack 10 illustrating the optional strip-type PDU 100. A plurality of mounting key holes 102 (enlarged for detail) are provided on the side 36 of the rack, behind the 1U side bays (see FIG. 4). One or more corresponding button 104 protrudes from the strip PDU 100 and slides into a locked position in the respective key hole 102 to secure the strip PDU 100 to the side of the rack. The strip PDU 100 receives A/C electrical power from a main electrical line 108 in the data center or building and includes a plurality of electrical sockets 106 into which devices may be plugged. The option to mount strip PDUs 100 in addition to the six 1U PDUs or other devices in the side bays provides a wide range of options for different customers to power the various 1U devices supported in the rack 10.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An electronic equipment rack, comprising:
    a rack frame having a front, a rear, and opposing sides;
    a pair of vertical rails in the rack frame spaced apart and having vertically-spaced mounting holes for mounting a column of components within a central rack space within the rack frame;
    a plurality of 1U side bays on opposite sides of the central rack space and outward of the vertical rails, wherein each vertical rail and corresponding sides of the rack frame each define an opening at the rear of the rack frame for receiving a vertically-oriented 1U component inserted into the respective 1U bay from the rear, wherein each vertical rail comprises a first leg parallel to the rear of the rack frame and defining the vertically-spaced mounting holes, and a second leg parallel to the sides of the rack frame and positioned outwardly of the vertically-spaced mounting holes, wherein the second leg of each vertical rail and corresponding sides of the rack frame are spaced for receiving the vertically-oriented 1U component inserted from the rear of the rack frame;
    a pair of horizontal rails oriented along the depth of the rack and positioned outwardly of the vertically-spaced mounting holes on the vertical rails, each horizontal rail including a mounting region with a plurality of horizontally-spaced mounting holes for receiving additional mounting hardware, wherein the mounting region of each horizontal rail containing the horizontally-spaced mounting holes is offset outwardly from the respective second leg of a corresponding vertical rail; and
    an end flange at a rear end of each horizontal rail, the end flange including flange mounting holes adjacent to the respective 1U bay for mounting the 1U component received into the 1U bay, wherein the second leg of each vertical rail is joined to the adjacent horizontal rail at a location outside the 1U bay.

2. The electronic equipment rack of claim 1, wherein the mounting region of each horizontal rail containing the horizontally-spaced mounting holes is sufficiently offset that the additional mounting hardware will not project inwardly beyond the second leg of the nearest vertical rail.

3. The electronic equipment rack of claim 1, wherein each horizontal rail further comprises:
    an enclosed front-to-back cable channel along the length of the horizontal rail.

4. The electronic equipment rack of claim 3, wherein each horizontal rail further comprises:
    an aperture to the cable channel near the end of the horizontal rail, wherein the aperture is wide enough to pass a plurality of cables including end connectors through the aperture.

5. The electronic equipment rack of claim 4, wherein the aperture further comprises:
    a narrowed portion that is toward one side of the horizontal rail, such that moving the cables into the narrowed portion urges the cables toward the one side of the horizontal rail.

6. The electronic equipment rack of claim 5, wherein the aperture is an L-shaped aperture in which the narrowed portion defines one leg of the L-shaped aperture and a comparatively wider portion of the L-shaped aperture defines another leg.

7. The electronic equipment rack of claim 1, wherein the mounting holes of the vertical rails simultaneously support a 42U column of components.

8. The electronic equipment rack of claim 1, wherein a height of the rack frame is adapted to receive three vertically-oriented 1U components on each side of the column of 42U of components, for a total of at least 48U of components simultaneously mounted in the rack.

9. The electronic equipment rack of claim 1, wherein the rack has a rack width of no more than 600 mm and a rack depth of no more than 1200 mm.

10. The electronic equipment rack of claim 9, wherein the vertical rails are spaced at least 450 mm apart.

11. The electronic equipment rack of claim 9, further comprising:
    a rear-door heat exchanger pivotably coupled to the rear of the rack frame; and a grill secured to a front of the rack frame, wherein the rack width is no more than 600 mm and the rack depth is no more than 1200 mm including the rear-door heat exchanger and the grill.

12. An electronic equipment rack, comprising:

a rack frame having a front, a rear, and opposing sides;

a pair of vertical rails in the rack frame spaced apart and having vertically-spaced mounting holes for mounting a column of components within a central rack space within the rack frame;

a plurality of 1U side bays on opposite sides of the central rack space and outward of the vertical rails, wherein each vertical rail and corresponding sides of the rack frame each define an opening at the rear of the rack frame for receiving a vertically-oriented 1U component inserted into the respective 1U bay from the rear, wherein each vertical rail comprises a first leg parallel to the rear of the rack frame and defining the vertically-spaced mounting holes, and a second leg parallel to the sides of the rack frame and positioned outwardly of the vertically-spaced mounting holes, wherein the second leg of each vertical rail and corresponding sides of the rack frame are spaced for receiving the vertically-oriented 1U component inserted from the rear of the rack frame; and a pair of horizontal rails oriented along the depth of the rack and positioned outwardly of the vertically-spaced mounting holes on the vertical rails, each horizontal rail including a mounting region with a plurality of horizontally-spaced mounting holes for receiving additional mounting hardware, wherein the mounting region of each horizontal rail containing the horizontally-spaced mounting holes is offset outwardly from the respective second leg of a corresponding vertical rail;

wherein each horizontal rail further comprises an enclosed front-to-back cable channel along the length of the horizontal rail and an aperture to the cable channel near the end of the horizontal rail, wherein the aperture is wide enough to pass a plurality of cables including end connectors through the aperture, and wherein the aperture further includes a narrowed portion that is toward one side of the horizontal rail, such that moving the cables into the narrowed portion urges the cables toward the one side of the horizontal rail.

* * * * *